(12) United States Patent
Tanaka

(10) Patent No.: US 8,906,806 B2
(45) Date of Patent: *Dec. 9, 2014

(54) METHOD OF MANUFACTURING SEMICONDUCTOR DEVICE

(71) Applicant: PS4 Luxco S.a.r.l., Luxembourg (LU)

(72) Inventor: Katsuhiko Tanaka, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/016,725

(22) Filed: Sep. 3, 2013

(65) Prior Publication Data

US 2014/0001030 A1   Jan. 2, 2014

Related U.S. Application Data

(63) Continuation of application No. 13/426,715, filed on Mar. 22, 2012, now Pat. No. 8,551,884.

(30) Foreign Application Priority Data

May 26, 2011   (JP) .................................. 2011-118009

(51) Int. Cl.
| | | |
|---|---|---|
| *H01L 21/44* | (2006.01) | |
| *H01L 21/768* | (2006.01) | |
| *C23C 14/04* | (2006.01) | |
| *C23C 14/34* | (2006.01) | |
| *H01L 21/285* | (2006.01) | |

(52) U.S. Cl.
CPC .... *H01L 21/76838* (2013.01); *H01L 21/76814* (2013.01); *H01L 21/76882* (2013.01); *C23C 14/046* (2013.01); *C23C 14/345* (2013.01); *H01L 21/76858* (2013.01); *C23C 14/3492* (2013.01); *H01L 21/76876* (2013.01); *H01L 21/2855* (2013.01)

USPC .... 438/688; 438/674; 438/676; 257/E21.091; 257/21.462

(58) Field of Classification Search
CPC ..................... H01J 37/32091; H01J 37/32082; H01J 37/321; H01J 37/32412; H01J 37/32357; H01L 21/31116; H01L 21/31138; H01L 21/6833; H01L 21/2236; H01L 21/31612; C23C 16/507; C23C 14/48
USPC .................. 438/674, 676, 688; 257/E21.091, 257/E21.462
See application file for complete search history.

(56) References Cited

U.S. PATENT DOCUMENTS

| | | | |
|---|---|---|---|
| 8,198,162 B2 | 6/2012 | Sekiguchi et al. | |
| 8,551,884 B2 * | 10/2013 | Tanaka | 438/674 |
| 2002/0006680 A1 * | 1/2002 | Katala et al. | 438/22 |

FOREIGN PATENT DOCUMENTS

| | | |
|---|---|---|
| JP | 06-169018 | 6/1994 |
| JP | 07-029853 | 1/1995 |

(Continued)

*Primary Examiner* — Michelle Mandala
(74) *Attorney, Agent, or Firm* — Young & Thompson

(57) ABSTRACT

A method of manufacturing a semiconductor device comprises forming a contact hole within an interlayer insulating film of a substrate and forming a contact plug while the substrate is heated. In forming the contact plug, the substrate is held on a stage within the chamber of a sputtering apparatus through a chuck, and an ESC voltage applied to the chuck is increased stepwise in a plurality of steps. First target power is applied to a target within the chamber to form a first Al film in the contact hole. Next, second target power higher than the first target power is applied to the target within the chamber to form a second Al film on the first Al film.

9 Claims, 17 Drawing Sheets

(56) References Cited

FOREIGN PATENT DOCUMENTS

| JP | 07-099170 | 4/1995 |
| JP | 07-130854 | 5/1995 |
| JP | 07-176615 | 7/1995 |
| JP | 11-243070 | 9/1999 |
| JP | 2008-045219 | 2/2008 |
| JP | 2009-010434 | 1/2009 |

* cited by examiner

METHOD OF MANUFACTURING SEMICONDUCTOR DEVICE

CROSS REFERENCE TO RELATED APPLICATIONS

This application is a continuation of application Ser. No. 13/426,715 filed on Mar. 22, 2012, which claims the benefit of priority from Japanese Patent Application No. 2011-118009 filed on May 26, 2011, the disclosure of which is incorporated herein in its entirety by reference.

BACKGROUND OF THE INVENTION

1. Field of the Invention

The present invention relates to a method of manufacturing a semiconductor device.

2. Description of the Related Art

Conventionally, a method using an Al reflow sputtering method has been proposed, in order to secure the embeddability of a conductive material at the time of burying the conductive material in a microstructure such as a contact hole. The Al reflow sputtering method has the characteristic of being capable of forming an Al film superior in embeddability and planarity by depositing the Al film and fluidizing the deposited Al film by high-temperature heating.

JP07-29853A and JP11-243070A describe that Al embeddability in a minute contact hole based on an Al reflow sputtering method is secured by using a titanium nitride film.

In addition, JP07-176615A describes that an Al surface morphology is secured using high-temperature sputtered Ti.

SUMMARY OF THE INVENTION

In one embodiment, there is provided a method of manufacturing a semiconductor device, comprising:

forming a contact hole within an interlayer insulating film of a substrate;

forming a barrier metal film and a seed Al film in this order on an inner wall of the contact hole; and performing the following steps (1)-(3) in this order while the substrate is heated, to form a contact plug:

(1) holding the substrate on a stage within a chamber of a sputtering apparatus through a chuck and increasing an ESC voltage applied to the chuck stepwise in a plurality of steps;

(2) applying first target power to a target within the chamber, to form a first Al film so as to fill the contact hole; and, (3) applying second target power higher than the first target power to the target within the chamber, to form a second Al film on the first Al film.

In another embodiment, there is provided a method of manufacturing a semiconductor device, comprising:

forming a contact hole within an interlayer insulating film of a substrate;

forming a barrier metal film and a seed Al film in this order on an inner wall of the contact hole; and performing the following steps (1)-(3) in this order while the substrate is heated, to form a contact plug:

(1) holding the substrate on a stage within a chamber of a sputtering apparatus through a chuck and increasing an ESC voltage applied to the chuck stepwise in three steps to a first voltage, a second voltage, and a third voltage, in this order;

(2) applying first target power to a target within the chamber, to form a first Al film so as to fill the contact hole; and, (3) applying second target power higher than the first target power to the target within the chamber, to form a second Al film on the first Al film.

BRIEF DESCRIPTION OF THE DRAWINGS

The above features and advantages of the present invention will be more apparent from the following description of certain preferred embodiments taken in conjunction with the accompanying drawings, in which.

Figure 1:
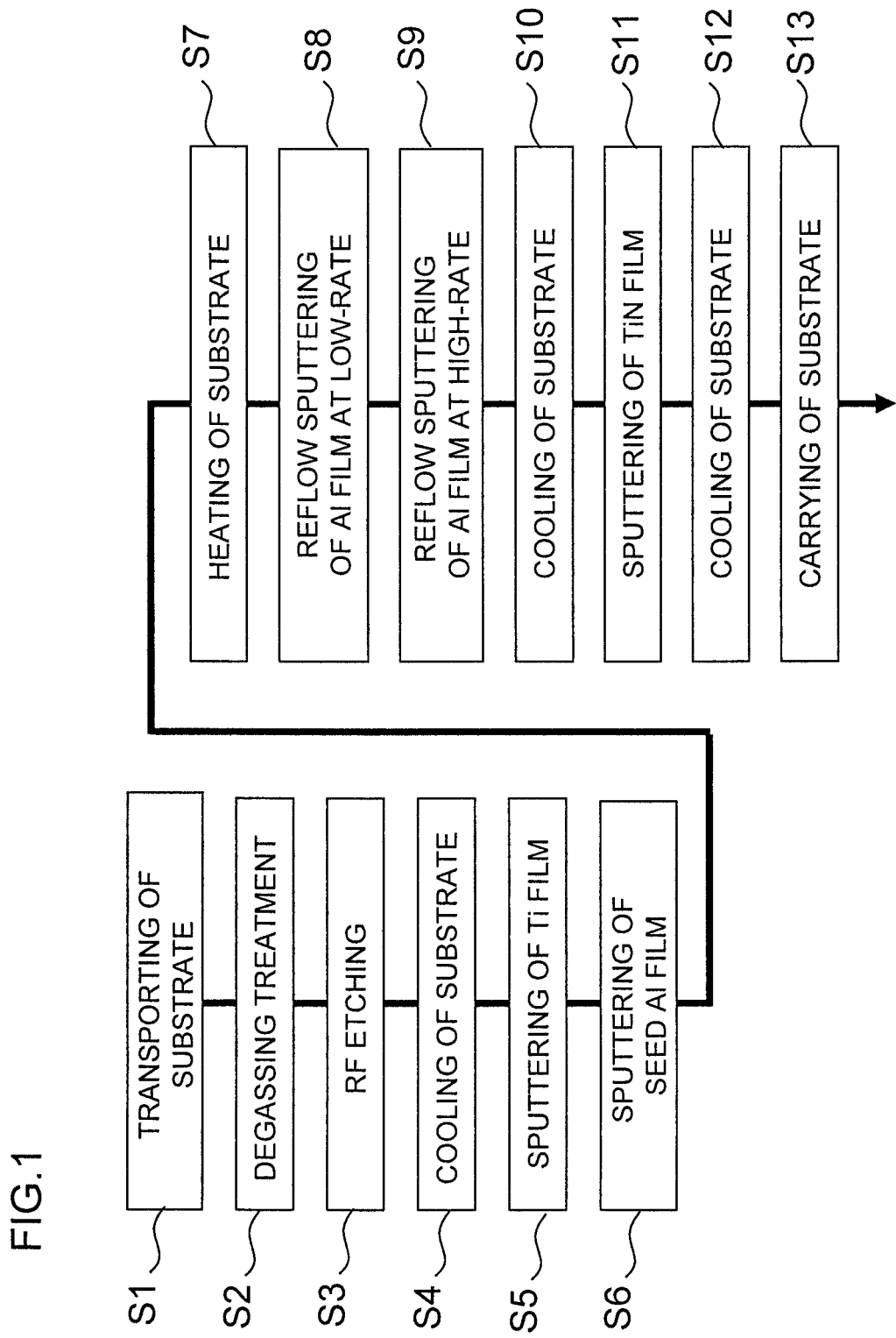
FIG. 1 is a flowchart illustrating one example of a method of manufacturing a semiconductor device according to the present invention.

In the drawings, numerals have the following meanings, 10: sputtering apparatus, 11 target; 12: stage, 13: substrate, 14: chamber, 15: pump, 16: DC power supply, 20: silicon substrate, 21, 27, 29: Ti film, 22: TiN film, 23: Al film, 24: TiN film, 25: interlayer insulating film, 26: contact hole, 28: Al film, 30: contact plug, 31: $TiAl_3$, 50: load port A, 51: load lock chamber, 52: first transfer region, 53: degassing chamber, 54: RF etching chamber, 55: cooling chamber, 56: second transfer region, 57: Ti film-forming chamber, 58: seed Al film-forming chamber, 59: Al reflow sputtering chamber, 60: cooling chamber, 61: TiN film-forming chamber, 62: load lock chamber, and 63: load port B.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In a method of manufacturing a semiconductor device, a barrier metal film and a seed Al film are formed in this order on an inner wall of a contact hole after a substrate is heated and cooled. Examples of the barrier metal film may include a Ti film, a laminated film composed of Ti/TiN films, and a laminated film composed of Ti/TiN/Ti films (all these laminated films are mentioned in this order from the inner wall side of the contact hole). A barrier metal film made of a Ti/TiN/Ti laminated film is preferred because the embedding margin of the seed Al film and the like can be enlarged greatly. The film thickness of the barrier metal film is preferably 5 to 30 nm, and the film thickness of the seed Al film is preferably 150 to 300 nm. The aspect ratio of the contact hole is preferably 3 or lower. The film thicknesses of the barrier metal film and the seed Al film and the aspect ratio of the contact hole are within these rages, thereby satisfactorily forming a first Al film in later process (2).

After this, three processes (1) to (3) described below are carried out in order while the substrate is heated. Consequently, a contact plug is formed. The substrate is maintained at approximately a constant temperature by heating during process (1) to process (3).

Figure 17:
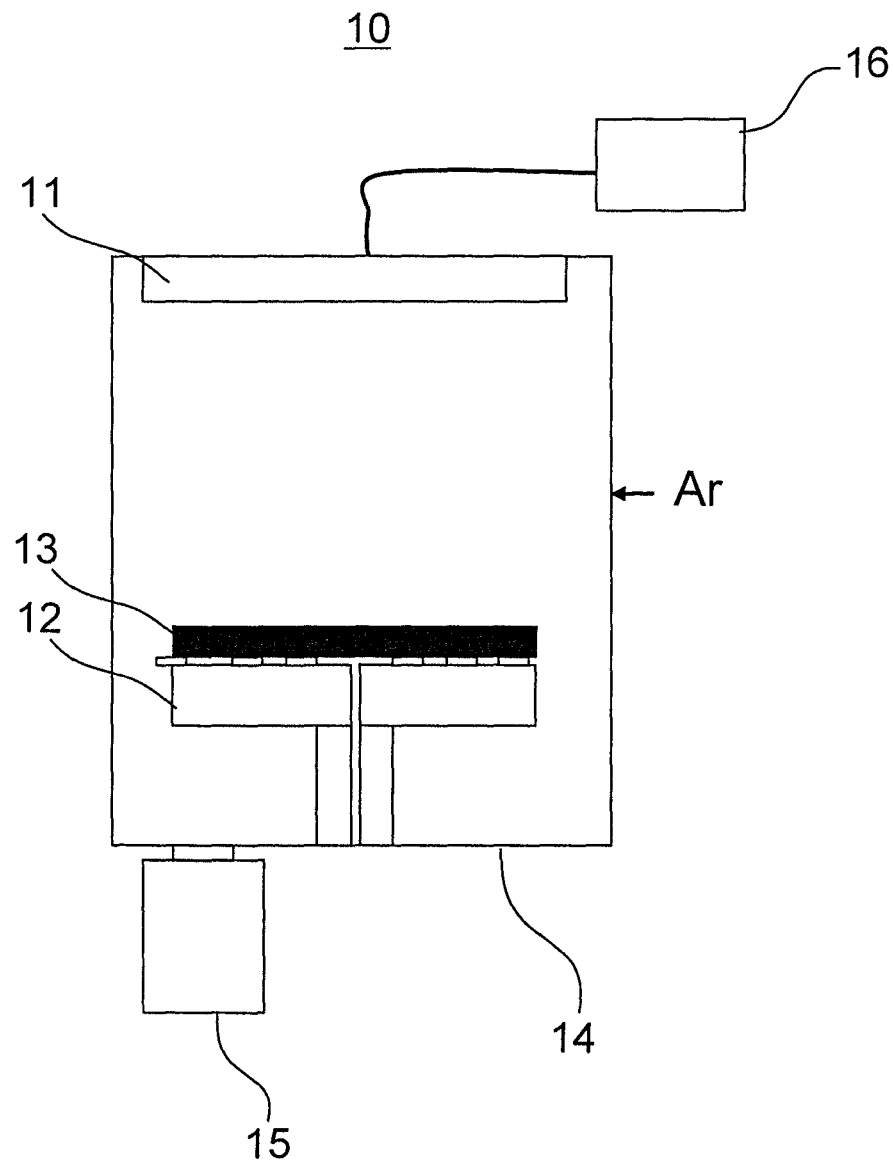
FIG. 17 is a schematic view illustrating an apparatus for carrying out reflow sputtering of Al film.

Processes (1) to (3) are performed by an apparatus for carrying out reflow sputtering of Al film. FIG. 17 is a schematic view illustrating the apparatus. As illustrated in FIG. 17, a substrate 13 is held on a stage 12 within a chamber 14 of a sputtering apparatus 10 through an electrostatic chuck (not shown). An ESC voltage can be applied to the substrate 13 though the electrostatic chuck. Noble gas for controlling temperature of substrate 13 is supplied to a space between the substrate 13 and stage 12 after the ESC voltage has reached the final voltage level. A target 11 is positioned opposite to the substrate 13 within the chamber 14, and target power can be applied to the target 11 by a DC power supply 16. Processes (1) to (3) will be explained in detail.

Process (1)

Process (1) is a pretreatment process prior to Al film formation. A substrate is held on a stage within a chamber through an electrostatic chuck, and an ESC voltage applied to the substrate though the electrostatic chuck is increased stepwise a plurality of steps. By varying the stage voltage stepwise in this way, the voltage applied to the substrate is increased gradually. Accordingly, internal stress is less likely to arise within the substrate. As a result, cracks in the substrate do not occur.

The second voltage is twice as large as the first voltage, and the third voltage is four times as large as the first voltage. A voltage which is a half or less of an adequate ESC voltage, is preferably applied as the first step, before the adequate ESC voltage is applied. Voltage in step (n) is preferably twice or less as large as voltage in step (n−1), wherein n means a natural number being larger than one. If in step (n), voltage which is over twice is applied, effects for inhibiting an occurrence of the crack becomes smaller. By lessening an increasing amount of voltage per one step, number of step can increase. In this case, the possibility for generating the crack can be reduced. On the other hand, time for applying the voltage becomes longer, resulting in deterioration of throughput. The increasing amount of voltage per one step and number of step can be determined, in consideration of the possibility for generating the crack such as the warpage amount of substrate 13 prior to the voltage application, and productivity. In the above example, voltage in the first step is one-fourth of the adequate ESC voltage, and the voltage has reached the adequate ESC voltage in three steps. Accordingly, the second voltage is twice as large as the first voltage, and the third voltage is twice as large as the second voltage. Voltage sequentially increases as the number of step increases. By setting the first, second and third voltages to within these ranges, it is possible to effectively prevent cracks in the substrate.

Process (2)

Process (2) is a process of film-forming a first Al. First target power is applied to a target within the chamber to form a first Al film in the contact hole. In the process of film-forming the first Al, an Al film is formed at a low film-forming rate by controlling the first target power to a relatively low level. Consequently, it is possible to bury the Al film in the contact hole with excellent embeddability, without generating voids in the contact hole. The film-forming rate of the first Al film is preferably 5 nm/s. By setting the film-forming rate to 5 nm/s, it is possible to secure excellent embeddability of the Al film in the contact hole.

Process (3)

Process (3) is a process of film-forming a second Al. Second target power higher than the first target power is applied to the target within the chamber to form a second Al film on the first Al film. In the process of film-forming the second Al film, an Al film is formed at a high film-forming rate by applying relatively high target power to the target within the chamber. In process (2), the first Al film superior in embeddability has already been buried in the contact hole. Consequently, in process (3), the second Al film can be efficiently formed on the first Al film by setting a high film-forming rate. Thus, it is possible to prevent cracks in a wafer. As a result, it is possible to enhance the productivity of semiconductor devices.

The film-forming rate of the second Al film is preferably 17 nm/s. By setting the film-forming rate to 17 nm/s. Since in the above example, the film-forming rate of the second Al film is 3 or more times as large as the film-forming rate of the first Al film, the productivity of the above example is remarkably improved, as compared with formation of the contact plug with only the first Al film.

The second target power is 4.8 times in this case, and it is preferable that the second target power is 4 or more times as large as the first target power. The first and second target powers are within these ranges, thereby shortening the film-forming time of Al and further improving productivity, while securing embeddability in the contact hole.

In processes (1) to (3), stage temperature within the chamber is preferably 400 to 450° C., and more preferably, 430° C.

Figure 2:
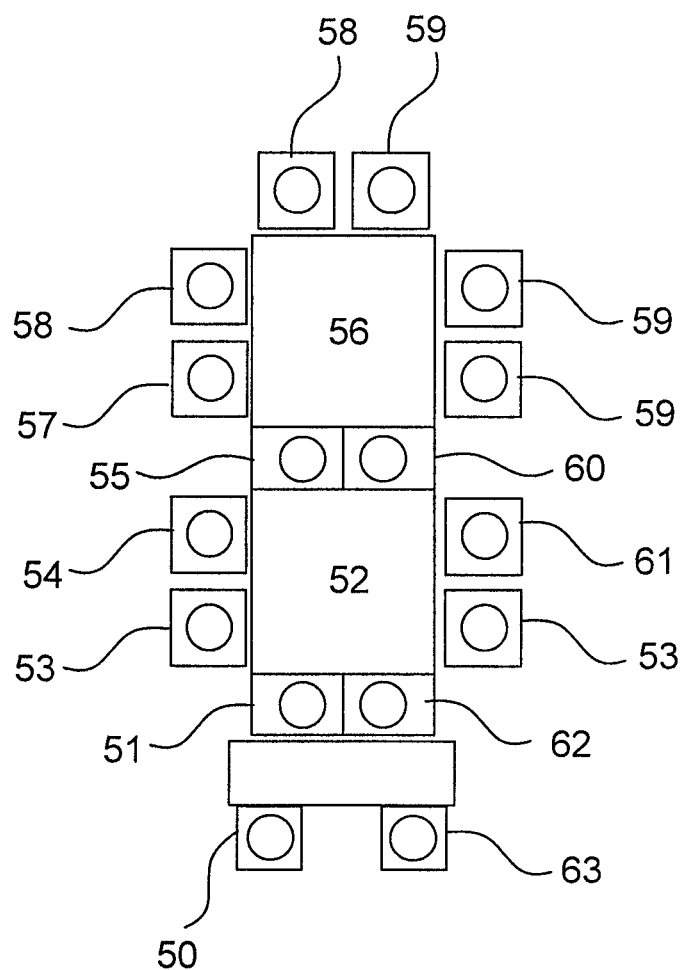
FIG. 2 is a schematic view illustrating an apparatus for carrying out respective steps of FIG. 1.

Hereinafter, one example of a method of manufacturing a semiconductor device will be described with reference to FIGS. 1 to 16. FIG. 1 is a flowchart illustrating respective processes of the semiconductor device manufacturing method. FIG. 2 is a schematic view illustrating an apparatus for manufacturing the semiconductor device. FIGS. 3 to 16 are schematic views illustrating the respective processes in the method of manufacturing the semiconductor device.

Figure 3:
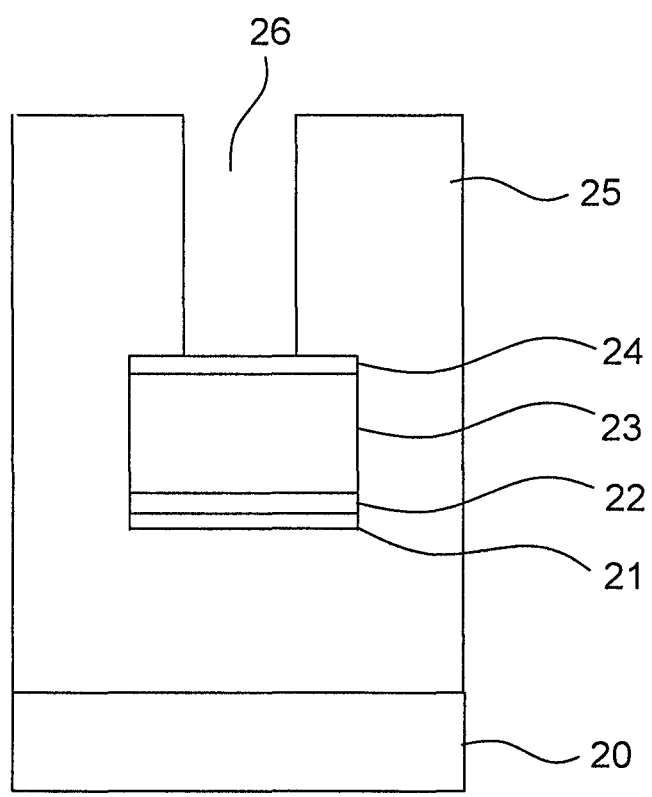
FIGS. 3 to 16 are schematic views illustrating a method of manufacturing the semiconductor device according to the present invention.

First, interlayer insulating film 25 including a wiring layer laminated with Ti film 21, TiN film 22, Al film 23 and TiN film 24 is formed on silicon substrate 20. By carrying out an RIE step, contact hole 26 is formed within interlayer insulating film 25 (FIG. 3).

Figure 4:
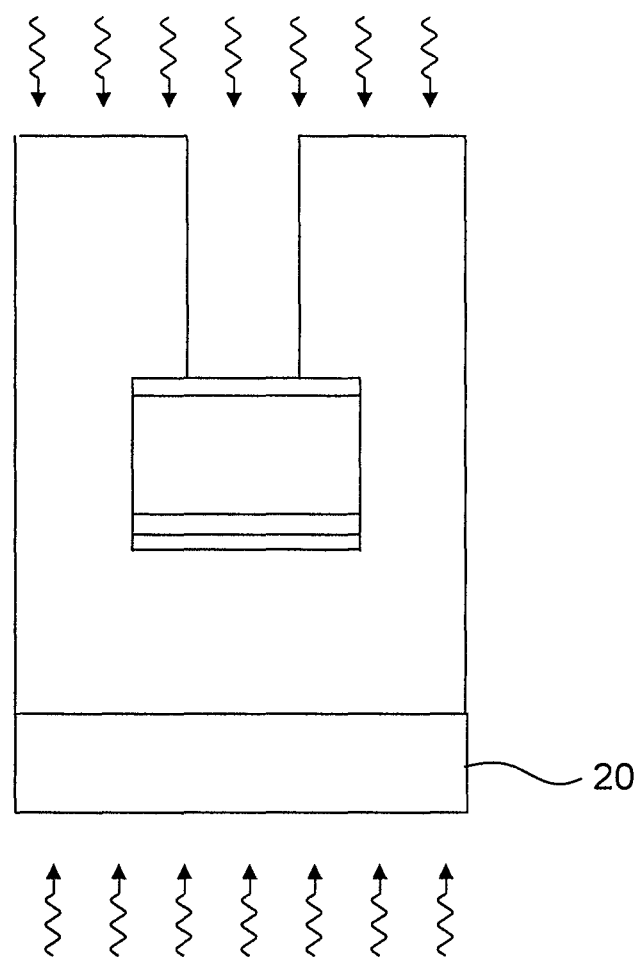

This silicon substrate 20 is transported from load port A 50 to load lock chamber 51 in FIG. 2. The silicon substrate 20 is then carried into degassing chamber 53 through first transfer region 52 (S1 in FIG. 1). A degassing treatment is performed on the silicon substrate 20 under the conditions of 450° C. in temperature, 8 Torr in pressure, and 90 seconds in time within degassing chamber 53 (S2 in FIG. 1; FIG. 4). Degassing conditions are not limited to these, however. For example, the degassing conditions may be set to a temperature range of 400 to 500° C., a pressure range of 3 to 10 Torr, and a time range of 20 to 120 seconds.

Figure 5:
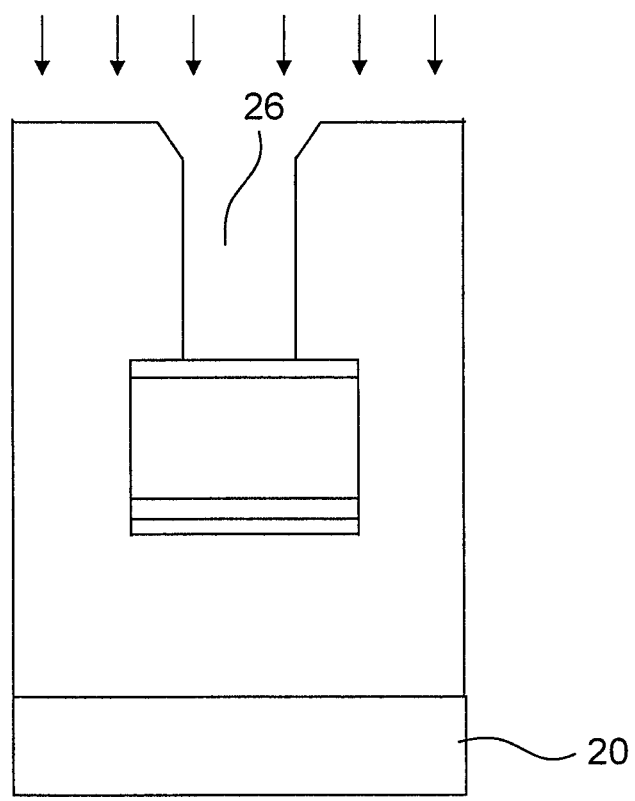

The silicon substrate 20 is carried from degassing chamber 53 in FIG. 2, through first transfer region 52, into RF etching chamber 54. Ar sputter etching is performed within RF etching chamber 54 (S3 in FIG. 1; FIG. 5). Consequently, it is possible to remove a surface oxide film of the wiring layer exposed on the bottom of the contact hole 26, and enlarge the aperture diameter of the contact hole 26, thereby allowing excellent Al embeddability to be secured in later steps. Although the oxide film-equivalent amount of Ar sputter etching at this time is set to 20 nm, the amount of etching is not limited to this, but may be set to within a range from 5 nm to 40 nm.

Figure 6:
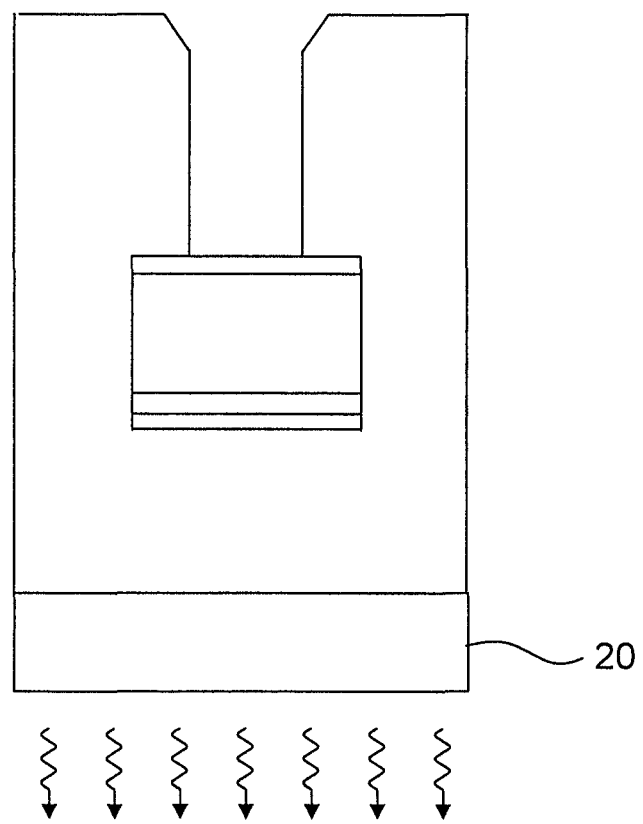

The silicon substrate 20 is carried from RF etching chamber 54 in FIG. 2, through first transfer region 52, into cooling chamber 55. The silicon substrate 20 is cooled down to 100° C. within cooling chamber 55 (S4 in FIG. 1; FIG. 6).

Figure 7:
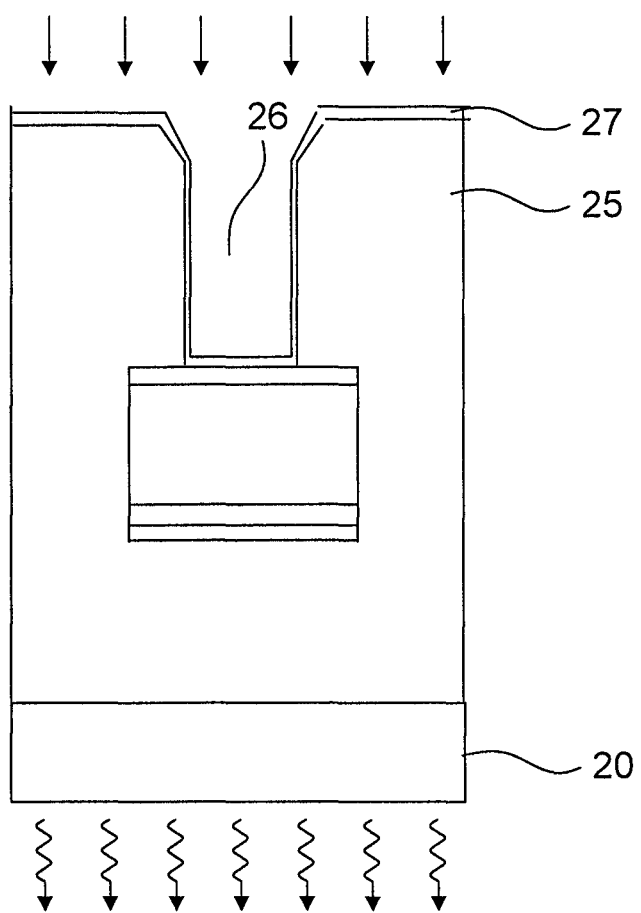

The silicon substrate 20 is transported from cooling chamber 55 in FIG. 2, through second transfer region 56, to a stage having an electrostatic chuck function within Ti film-forming chamber 57. Thus, the silicon substrate 20 is held on the stage through an electrostatic chuck. The silicon substrate 20 is maintained at a temperature of approximately 23° C. by means of gas conduction, while flowing an Ar gas through a space between the stage of Ti film-forming chamber 57 and the silicon substrate 20. The supply pressure of the Ar gas at this time is preferably adjusted by pressure application to within a range from 3 to 10 Torr. Subsequently, a Ti film 27 is formed within the contact hole 26 and on the entire surface of the interlayer insulating film 25 by means of sputtering, under the film-forming conditions of 20 nm in film thickness, 23° C. in film-forming temperature, and 35 kW in target power (power density: 29.6 W/cm$^2$) (S5 in FIG. 1; FIG. 7). The film-forming conditions of Ti film 27 are not limited to these, however, but may be set to a film thickness range of 5 to 30 nm, a film-forming temperature range of 0 to 100° C., and a target power range of 5 to 40 kW (power density: 4.2 to 33.8 W/cm$^2$).

Figure 8:
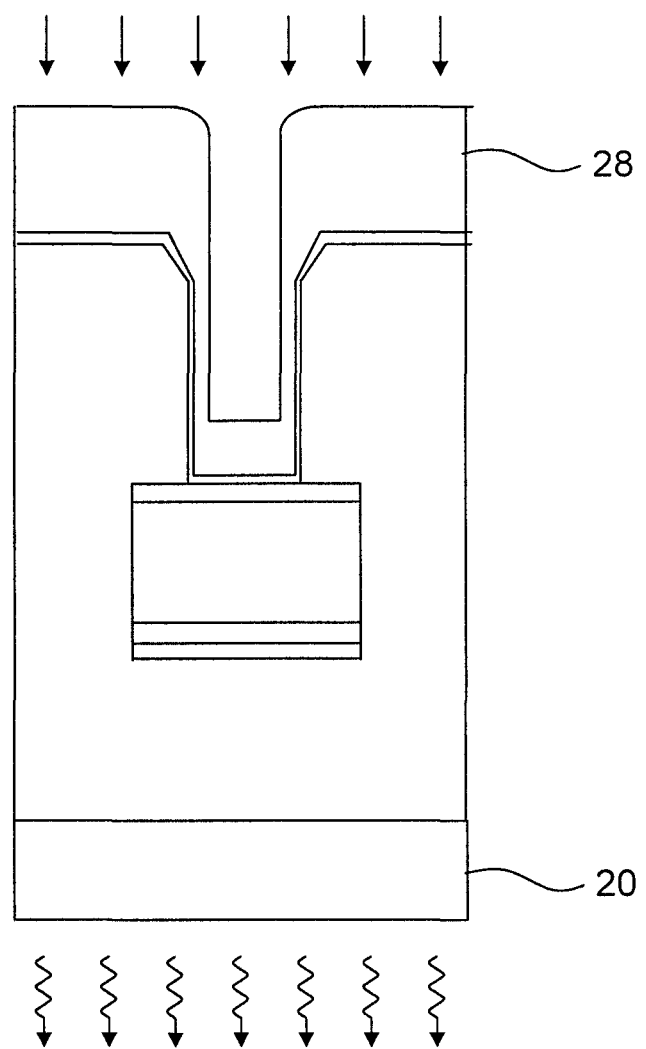

The silicon substrate 20 is transported from Ti film-forming chamber 57 in FIG. 2, through second transfer region 56, to seed Al film-forming chamber 58 (S6 in FIG. 1; FIG. 8). Film-forming conditions of the seed Al film 28 at this time are specified as 300 nm in film thickness, 23° C. in film-forming temperature, and 35 kW in target power (power density: 23.3 W/cm$^2$). The film-forming conditions of the seed Al film 28 are not limited to these, however, but may be set to a film thickness range of 150 nm to 400 nm, a film-forming temperature range of 0° C. to 100° C., and a target power range of 30 kW to 40 kW (power density: 20 W/cm$^2$ to 33.8 W/cm$^2$).

The silicon substrate 20 is transported from seed Al film-forming chamber 58 in FIG. 2, through second transfer region 56, onto a stage of Al reflow sputtering chamber 59 having an electrostatic chuck function and a heating function. The silicon substrate 20 is held on the stage by an electrostatic chuck.

Next, the heating of the silicon substrate 20 within the same chamber 59 and the formation of the first Al film and the second Al film by a reflow sputtering method are performed in this order. Hereinafter, respective steps will be described with reference to FIGS. 9 to 14.

Figure 9:
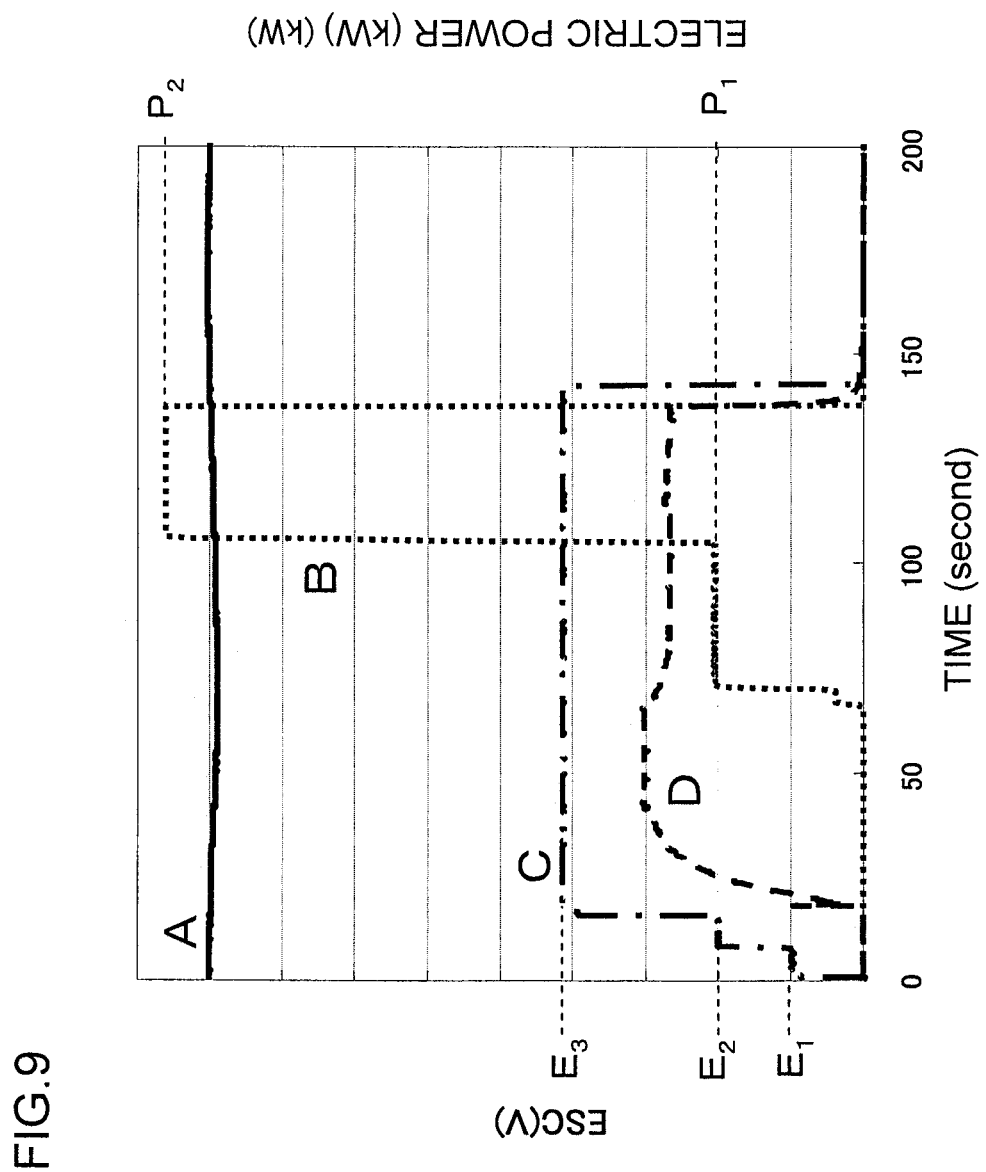

FIG. 9 is a graphical view illustrating reflow sputtering conditions for forming the first and second Al films. In FIG. 9, reference character A denotes the temperature of a stage, reference character B denotes target power applied to a target, reference character C denotes an ESC voltage applied to a silicon substrate 20 through an electrostatic chuck, and reference character D denotes a stage pressure (the pressure of an Ar gas flowed through a gap between the silicon substrate 20 and the stage).

Figure 10:
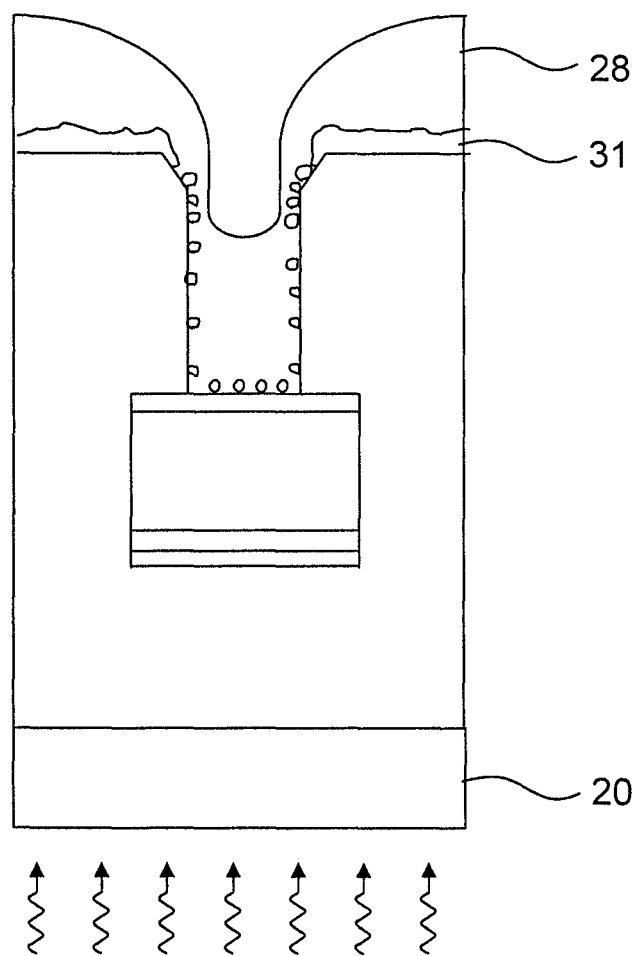

First, the ESC voltage is increased stepwise in three steps to a first voltage $E_1$, a second voltage $E_2$, and a third voltage $E_3$, in this order, under the heating condition of 430° C. in heating temperature (process (1)). After the ESC voltage is increased to the third voltage $E_3$, an Ar gas is flowed through a space between the stage and the silicon substrate 20, to continue to heat the silicon substrate 20 by means of gas conduction (S7 in FIG. 1; FIGS. 9 and 10). At this time, part of the seed Al film 28 and the Ti film 27 (not shown) formed earlier react with each other within the chamber after a heating time of approximately 60 seconds, thereby forming TiAl$_3$ 31. The heating conditions of the silicon substrate 20 are not limited to these, however, but may be set to a temperature range of 400 to 450° C. and a heating time range of 30 to 90 seconds.

Figure 11:
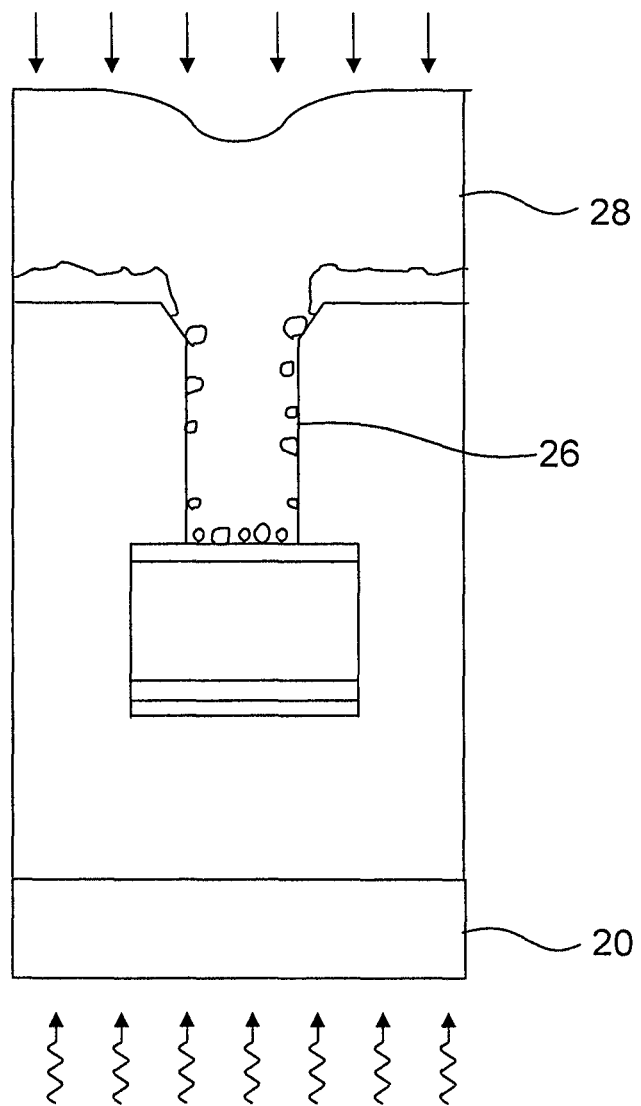

An Al film is formed as the first Al film by low-rate Al reflow sputtering by applying first target power to the target with the silicon substrate 20 maintained at a temperature of 430° C. by heating (first Al reflow sputtering in process (2), i.e., S8 in FIG. 1, FIGS. 9 and 11). In FIG. 11, the seed Al film and first Al film are illustrated by reference number 28, and a boundary between these films is not illustrated. Consequently, the contact hole 26 is filled with the first Al film 28. The first Al film 28 is formed under the film-forming conditions of 200 nm in film thickness, 430° C. in temperature, and 5 kW in target power. The film-forming conditions of the first Al film 28 are not limited to these, however. Alternatively, first film-forming conditions may be set to, for example, a film thickness range of 100 to 300 nm, a temperature range of 400 to 450° C., and a first target power range of 2 to 8 kW (power density: 1.33 to 5.32 W/cm$^2$).

Figure 12:
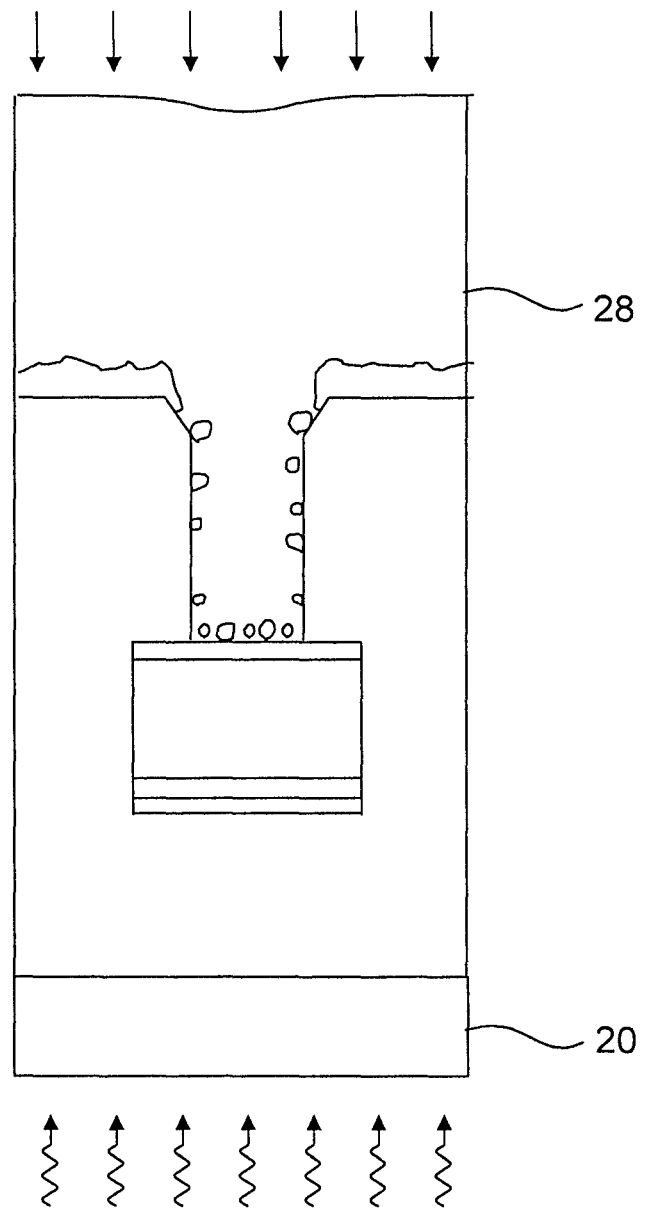

Subsequently, an Al film is formed as the second Al film by high-rate Al reflow sputtering by applying second target power higher than the first target power to the target with the silicon substrate 20 maintained at a temperature of 430° C. by heating (second Al reflow sputtering in process (3), i.e., S9 in FIG. 1; FIGS. 9 and 12). In FIG. 12, the seed Al film, the first Al film and the second Al film are illustrated by reference number 28, and a boundary between these films is not illustrated. The conditions of film formation of the second Al film 28 are specified as 400 nm in film thickness, 430° C. in temperature, and 20 kW in target power (power density: 13.3 W/cm$^2$). The film-forming conditions of the second Al film 28 are not limited to these, however. Alternatively, the film-forming conditions may be set to, for example, a film thickness range of 200 to 600 nm, a temperature range of 400 to 450° C., and a second target power range of 15 to 25 kW (power density: 9.98 to 16.6 W/cm$^2$).

Figure 13:
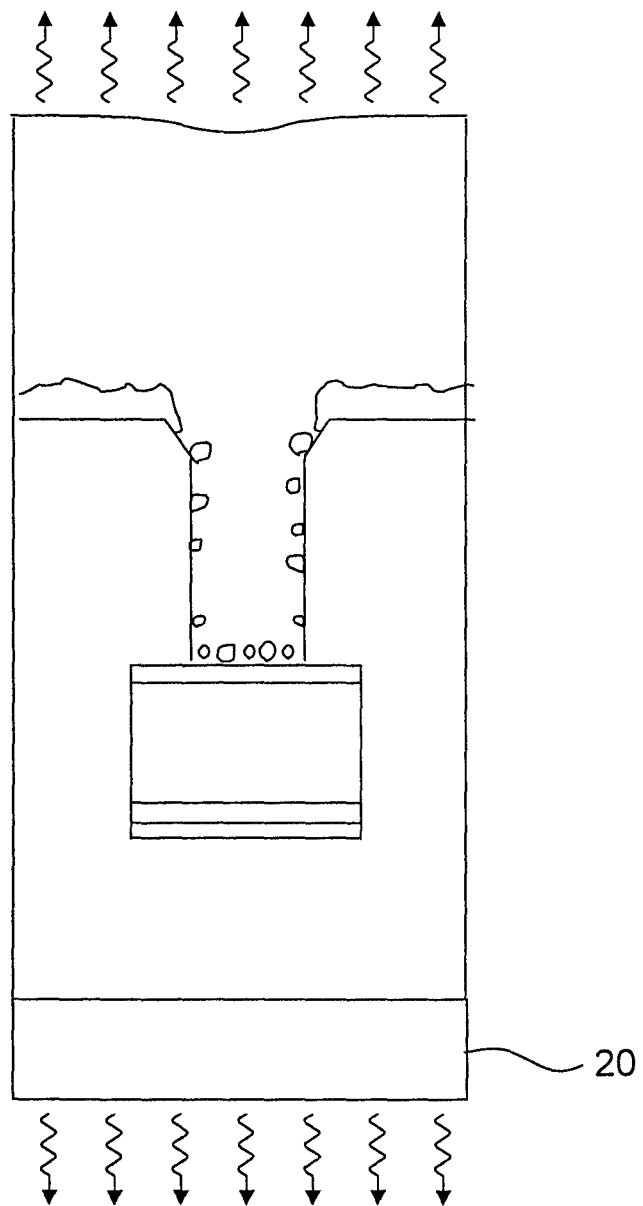

The silicon substrate 20 is transported from Al reflow sputtering chamber 59 in FIG. 2, through second transfer region 56, to cooling chamber 60. Cooling conditions are set to 23° C. in temperature, 3 Torr in stage pressure, and 30 seconds in time, to cool the silicon substrate 20 down to 200° C. or lower (S10 in FIG. 1; FIG. 13). The cooling conditions are not limited to these, however, but may be set to a stage pressure range of 1 to 5 Torr and a time range of 5 to 30 seconds.

Figure 14:
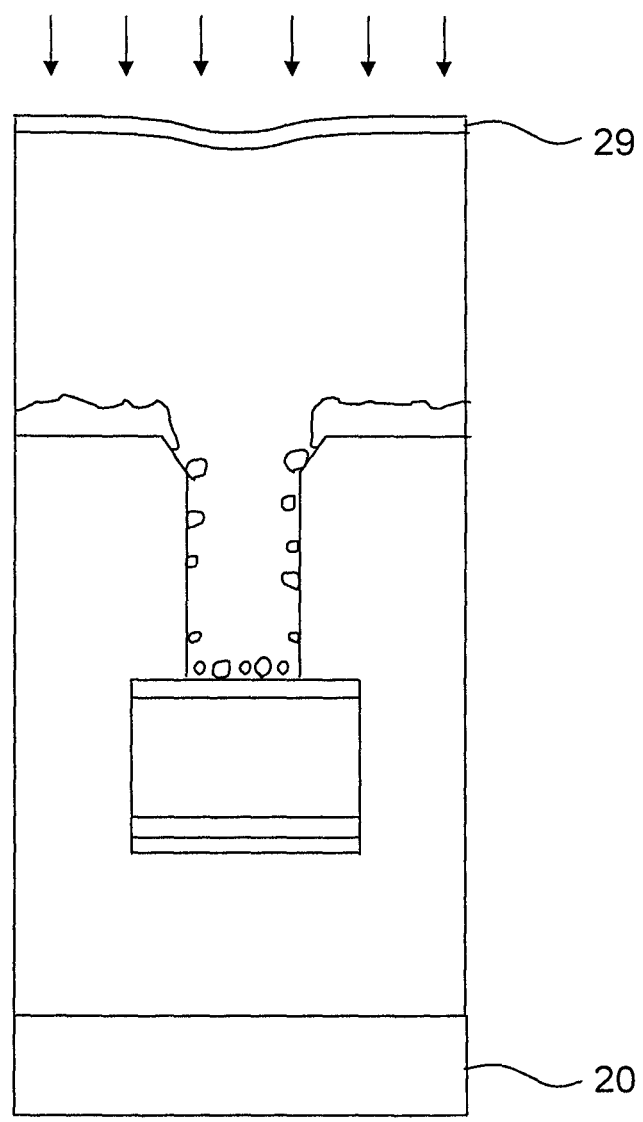

The silicon substrate 20 is transported from cooling chamber 60 in FIG. 2, through first transfer region 52, to TiN film-forming chamber 61. The silicon substrate 20 is transported to a stage of TiN film-forming chamber 61, and is held on the stage by an electrostatic chuck. Film-forming conditions of TiN film 29 are set to 30 nm in film thickness, 23° C. in film-forming temperature, and 15 kW in target power (power density: 11.6 W/cm$^2$), to form a TiN film 29 which is an antireflection film (S11 in FIG. 1; FIG. 14). The film-forming conditions of the TiN film 29 are not limited to these, however, but may be set to a film thickness range of 20 to 70 nm, a film-forming temperature range of 0 to 200° C., and a target power range of 10 to 20 kW (power density: 7.70 to 15.4 W/cm$^2$).

Figure 15:
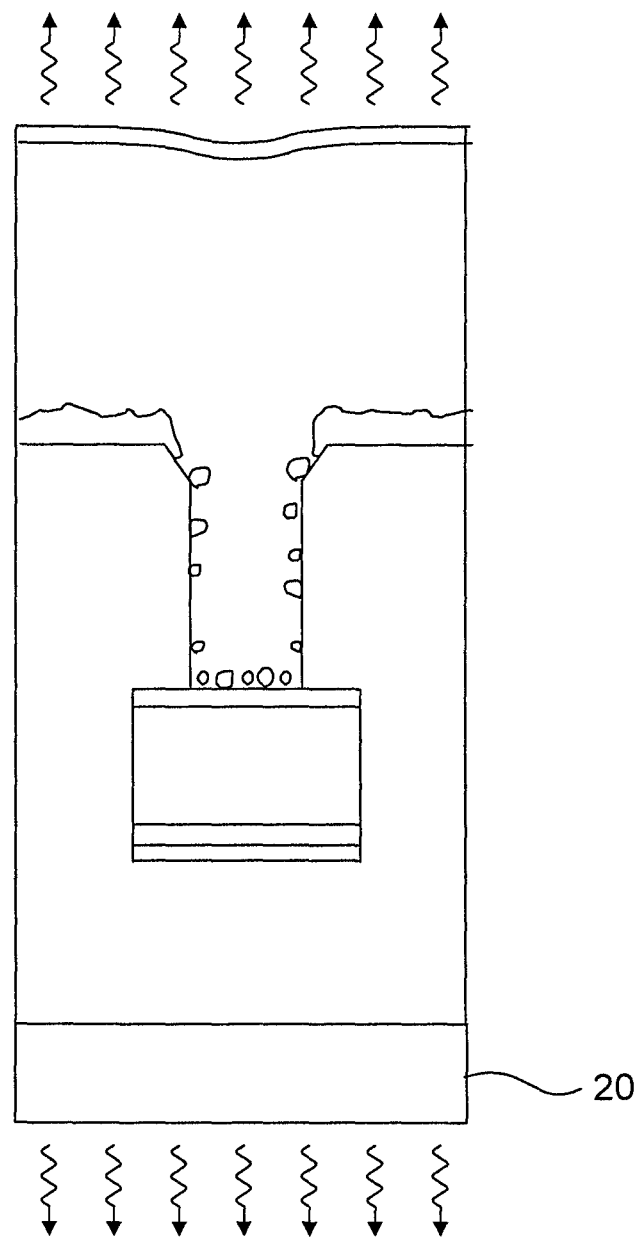

The silicon substrate 20 is transported from TiN film-forming chamber 61 in FIG. 2, through first transfer region 52, to load lock chamber 62. Cooling conditions of the silicon substrate 20 are set to 23° C. in temperature, 4 Torr in stage pressure, and 10 seconds in time, to cool the silicon substrate 20 (S12 in FIG. 1; FIG. 15). The cooling conditions are not limited to these, however, but may be set to a stage pressure range of 2 to 10 Torr and a time range of 5 to 30 seconds.

The silicon substrate 20 after cooling is transported from load lock chamber 62 in FIG. 2 to load port B 63, and then transported from the semiconductor manufacturing apparatus to the outside (S13 in FIG. 1).

Figure 16:
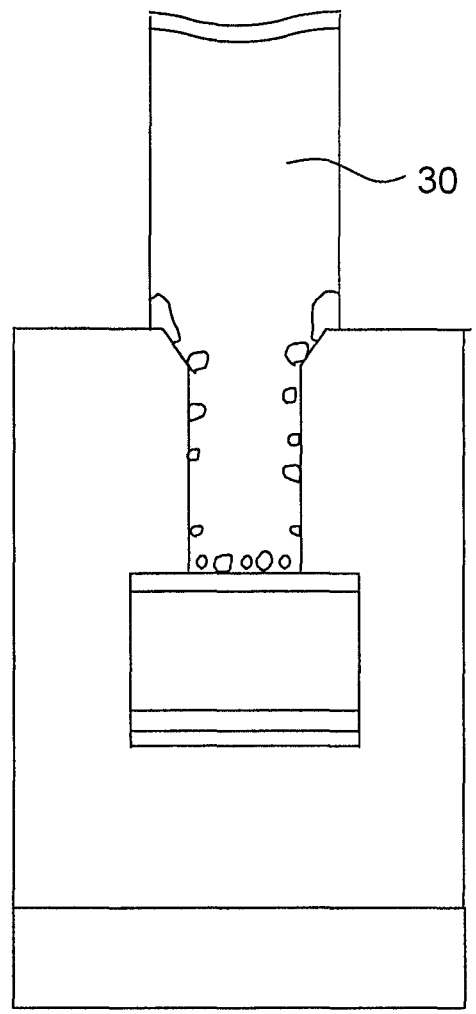

As illustrated in FIG. 16, etching using a lithography technique is performed on respective laminated materials to form a contact plug 30.

It is apparent that the present invention is not limited to the above embodiments, but may be modified and changed without departing from the scope and spirit of the invention.

What is claimed is:

1. A method comprising:
performing steps (1)-(3) in order while a substrate is heated, to form a first film comprising second and third films over the substrate, each of the second and third films containing at least aluminum:
(1) holding the substrate on a stage in a chamber of a sputtering apparatus through a chuck and increasing a voltage applied to the chuck stepwise in a plurality of steps;
(2) applying a first target power to a target in the chamber, to form the second film over the substrate; and
(3) applying a second target power to the target in the chamber, to form the third film on the second film.

2. The method according to claim 1, wherein the substrate comprises a semiconductor substrate.

3. The method according to claim 1, wherein in the step (3), the second target power is higher than the first target power.

4. The method according to claim 1, wherein in the step (1), the plurality of steps include a first step and a final step following the first step, and the voltage in the first step is one half or less of the voltage in the final step.

5. The method according to claim 1, wherein in the step (1), the plurality of steps include an (n−1)th step and an (n)th step following the (n−1)th step, the voltage applied to the chuck being a first voltage in the (n−1)th step, the voltage applied to the chuck being a second voltage in the (n)th step, the second voltage being in the range of double from one time of the first voltage, where n is a natural number greater than 1.

6. The method according to claim 1, wherein in the step (3), the second target power is four or more times as large as the first target power.

7. The method according to claim 1, wherein in the step (3), a film-forming rate of the third film is larger than a film-forming rate of the second film.

8. The method according to claim 1, wherein in the steps (1) to (3), the substrate is heated at 400° C. or more.

9. The method according to claim 4, wherein in the steps (1), a noble gas for controlling a substrate temperature is supplied to a back side surface of the substrate after the voltage applied to the chuck has reached the voltage in the final step.

* * * * *